US012622112B2

(12) United States Patent
Lin et al.

(10) Patent No.: US 12,622,112 B2
(45) Date of Patent: May 5, 2026

(54) DISPLAY DEVICE

(71) Applicant: AUO Corporation, Hsin-Chu (TW)

(72) Inventors: Tzu-Chieh Lin, Hsin-Chu (TW);
Chun-Liang Lin, Hsin-Chu (TW)

(73) Assignee: AUO CORPORATION, Hsin-Chu
(TW)

( * ) Notice: Subject to any disclaimer, the term of this
patent is extended or adjusted under 35
U.S.C. 154(b) by 394 days.

(21) Appl. No.: 18/544,704

(22) Filed: Dec. 19, 2023

(65) Prior Publication Data

US 2024/0421267 A1 Dec. 19, 2024

(30) Foreign Application Priority Data

Jun. 17, 2023 (TW) ................................. 112122843

(51) Int. Cl.
H10H 20/851 (2025.01)
H10H 20/841 (2025.01)
H10W 90/00 (2026.01)

(52) U.S. Cl.
CPC ...... H10H 20/8514 (2025.01); H10H 20/841
(2025.01); H10W 90/00 (2026.01)

(58) Field of Classification Search
None
See application file for complete search history.

(56) References Cited

U.S. PATENT DOCUMENTS

| | | | |
|---|---|---|---|
| 2017/0125740 A1 | 5/2017 | Lee | |
| 2017/0278826 A1* | 9/2017 | Sugizaki | ............. H10F 39/8053 |
| 2021/0288291 A1 | 9/2021 | Lee | |
| 2022/0238606 A1 | 7/2022 | Jeong | |
| 2023/0163258 A1* | 5/2023 | Yoon | .................. H10H 20/8514 |
| | | | 257/555 |

FOREIGN PATENT DOCUMENTS

CN 115117220 A 9/2022

* cited by examiner

*Primary Examiner* — Michelle Mandala
(74) *Attorney, Agent, or Firm* — McClure, Qualey &
Rodack, LLP

(57) ABSTRACT

A display device includes a light-emitting substrate, a coun-
ter substrate, multiple color conversion layers, a low-refrac-
tive-index layer, and multiple patterned Fabry-Perot filter
layers. The light-emitting substrate is used to emit a light.
The counter substrate is disposed opposite to the light-
emitting substrate. The color conversion layers are disposed
between the light-emitting substrate and the counter sub-
strate. The low-refractive-index layer is disposed between
the counter substrate and the color conversion layers. The
refractive index of the low-refractive-index layer is less than
or equal to that of the color conversion layers. The patterned
Fabry-Perot filter layers are disposed between the low-
refractive-index layer and the color conversion layers. Each
of the patterned Fabry-Perot filter layers has multiple
through-holes and includes two reflective layers and a spacer
layer between the two reflective layers. The material of the
two reflective layers includes silver, and the material of the
spacer layer includes silicon oxide.

19 Claims, 5 Drawing Sheets

DISPLAY DEVICE

CROSS-REFERENCE TO RELATED APPLICATION

This application claims priority to Taiwan Application Serial Number 112122843, filed Jun. 17, 2023, which is herein incorporated by reference in its entirety.

BACKGROUND

Field of Invention

The present disclosure relates to a display device, and in particular, to a display device including patterned Fabry-Perot filter layers.

Description of Related Art

A micro-light-emitting diode (micro-LED) display device has the advantages of power saving, high efficiency, high brightness, fast response time, etc. In order to achieve full-color, one current approach is to dispose a color conversion material on a micro-light-emitting diode that needs light color conversion, to convert a light color of the micro-light-emitting diode into a different light color. However, the above approach still has the problem that the light of the micro-light-emitting diode can not be fully converted into a predetermined colored light, resulting in poor light conversion efficiency and insufficient color purity of the color of the outgoing light.

SUMMARY

The disclosure provides a display device, which can improve the light conversion efficiency and the color purity of the color of the outgoing light.

The display device according to at least one embodiment of the present disclosure includes a light-emitting substrate, a counter substrate, multiple color conversion layers, a low-refractive-index layer, and multiple patterned Fabry-Perot filter layers. The light-emitting substrate is used to emit a light. The counter substrate is disposed opposite to the light-emitting substrate. The color conversion layers are disposed between the light-emitting substrate and the counter substrate. The low-refractive-index layer is disposed between the counter substrate and the color conversion layers. The refractive index of the low-refractive-index layer is less than or equal to the refractive index of each of the color conversion layers. The patterned Fabry-Perot filter layers are disposed between the low-refractive-index layer and the color conversion layers. Each of the patterned Fabry-Perot filter layers has multiple through-holes and includes two reflective layers and a spacer layer between the two reflective layers. The material of the two reflective layers includes silver, and the material of the spacer layer includes silicon oxide.

The display device according to at least another embodiment of the present disclosure includes a light-emitting substrate, a counter substrate, multiple color conversion layers, a low-refractive-index layer, and multiple patterned Fabry-Perot filter layers. The light-emitting substrate is used to emit a light. The counter substrate is disposed opposite to the light-emitting substrate. The color conversion layers are disposed between the light-emitting substrate and the counter substrate, and include multiple first color conversion layers and multiple second color conversion layers, which are used to convert the light into a first colored light and a second colored light, respectively, where the color of the first colored light is different from the color of the second colored light. The low-refractive-index layer is disposed between the counter substrate and the color conversion layers. The refractive index of the low-refractive-index layer is less than or equal to the refractive index of each of the color conversion layers. Each of the patterned Fabry-Perot filter layers has multiple through-holes. The patterned Fabry-Perot filter layers include multiple first patterned Fabry-Perot filter layers and multiple second patterned Fabry-Perot filter layers. Each of the first patterned Fabry-Perot filter layers is disposed between each of the first color conversion layers and the low-refractive-index layer, and includes a first intermediate layer. Each of the second Fabry-Perot filter layers is disposed between each of the second color conversion layers and the low-refractive-index layer, and includes a second intermediate layer. The thickness of the first intermediate layer is different from the thickness of the second intermediate layer.

DETAILED DESCRIPTION

Figure 1:
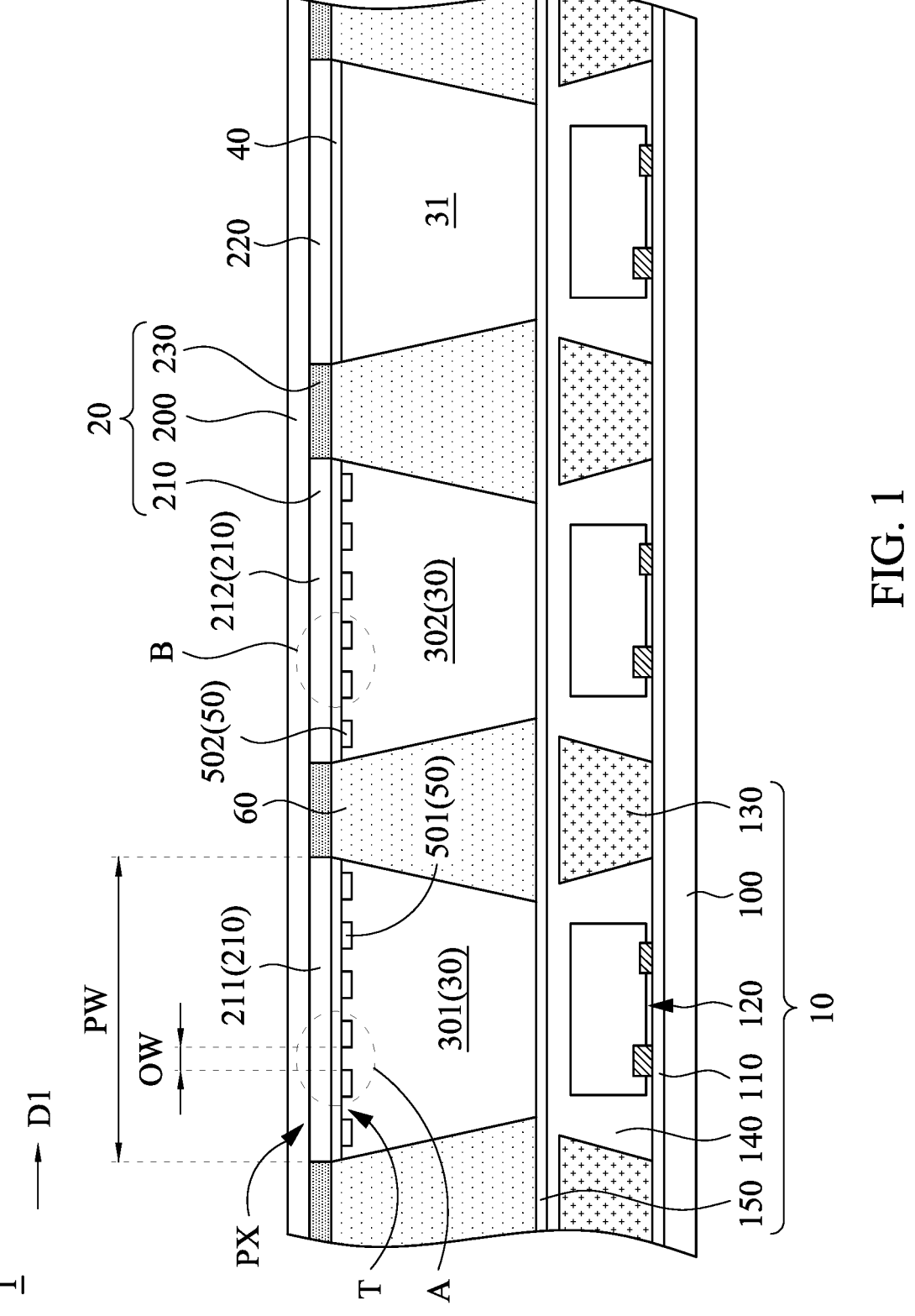
FIG. 1 is a partial cross-sectional schematic diagram of a display device according to at least one embodiment of the present disclosure.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Furthermore, the words "about", "approximately" or "substantially" used in the present disclosure not only cover the clearly stated numerical values and numerical ranges, but also cover those that can be understood by a person with ordinary knowledge in the technical field to which the present disclosure belongs. The permissible deviation range can be determined by the error generated during measurement, and the error is caused, for example, by limitations of the measurement system or process conditions. For example, two objects (such as the plane or traces of a substrate) are "substantially parallel" or "substantially perpendicular," where "substantially parallel" and "substantially perpendicular," respectively, mean that parallelism and perpendicularity between the two objects can include non-parallelism and non-perpendicularity caused by permissible deviation ranges.

In addition, "about" may mean within one or more standard deviations of the above values, such as within ±30%, ±20%, ±10%, or ±5%. Such words as "about", "approximately", or "substantially" as appearing in the present disclosure may be used to select an acceptable range of deviation or standard deviation according to optical properties, etching properties, mechanical properties, or other properties, rather than applying all of the above optical properties, etching properties, mechanical properties, and other properties with a single standard deviation.

The spatial relative terms used in the present disclosure, such as "below," "under," "above," "on," and the like, are intended to facilitate the recitation of a relative relationship between one element or feature and another as depicted in the drawings. The true meaning of these spatial relative terms includes other orientations. For example, the relationship between one element and another may change from "below" and "under" to "above" and "on" when the drawing is turned 180 degrees up or down. In addition, spatially relative descriptions used in the present disclosure should be interpreted in the same manner.

It should be understood that while the present disclosure may use terms such as "first", "second", "third" to describe various elements or features, these elements or features should not be limited by these terms. These terms are primarily used to distinguish one element from another, or one feature from another. In addition, the term "or" as used in the present disclosure may include, as appropriate, any one or a combination of the listed items in association.

Moreover, the present disclosure may be implemented or applied in various other specific embodiments, and the details of the present disclosure may be combined, modified, and altered in various embodiments based on different viewpoints and applications, without departing from the idea of the present disclosure.

Figure 2:
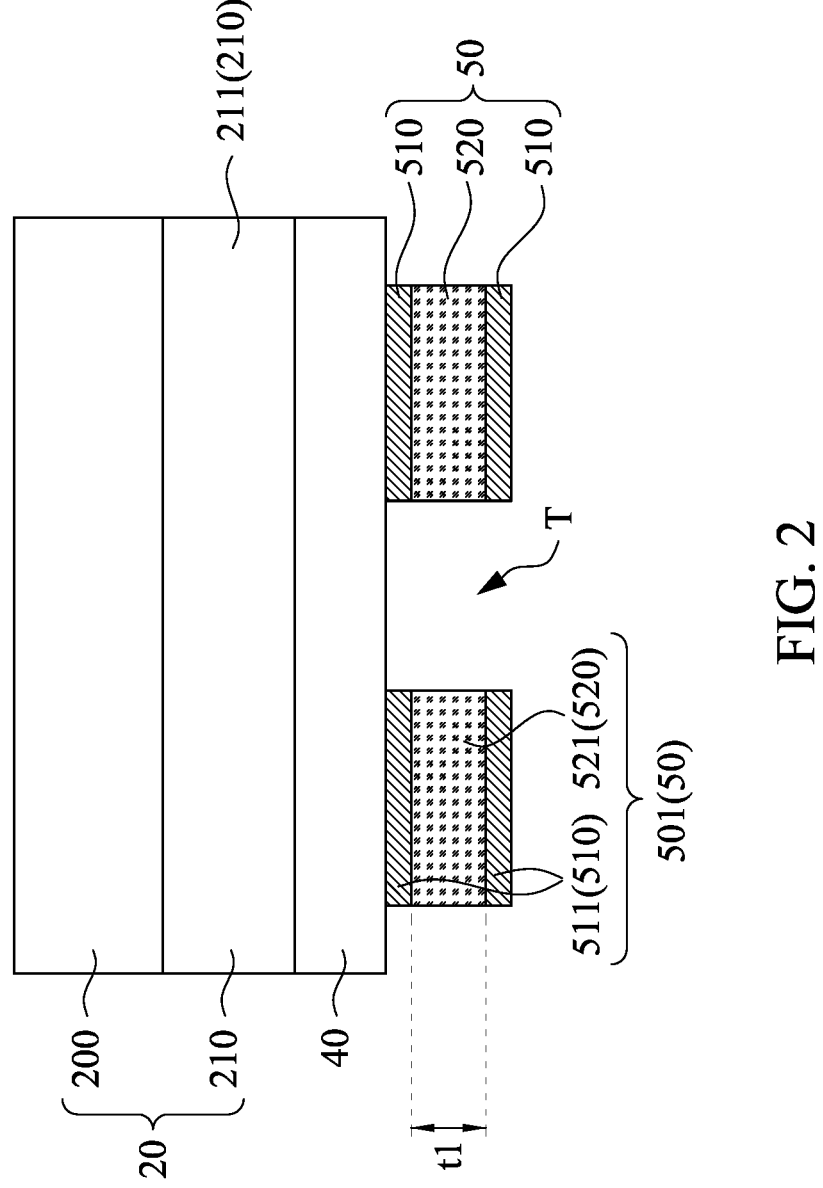
FIG. 2 is an enlarged schematic diagram of an area A in FIG. 1.

FIG. 1 is a partial cross-sectional schematic diagram of a display device according to at least one embodiment of the present disclosure. FIG. 2 is an enlarged schematic diagram of an area A in FIG. 1. Referring to FIGS. 1 and 2, a display device 1 includes a light-emitting substrate 10, a counter substrate 20, multiple color conversion layers 30, a low-refractive-index layer 40, and multiple patterned Fabry-Perot filter layers 50. The light-emitting substrate 10 is used to emit a light. The counter substrate 20 is disposed opposite to the light-emitting substrate 10. The color conversion layers 30 are disposed between the light-emitting substrate 10 and the counter substrate 20. The low-refractive-index layer 40 is disposed between the counter substrate 20 and the color conversion layers 30. The refractive index of the low-refractive-index layer 40 is less than or equal to the refractive index of each color conversion layer 30. For example, the refractive index of the low-refractive-index layer 40 may be between 1.2 and 1.9, while the refractive index of the color conversion layer 30 may be between 1.6 and 2.2.

The patterned Fabry-Perot filter layers 50 are disposed between the low-refractive-index layer 40 and the color conversion layers 30. Each of the patterned Fabry-Perot filter layers has multiple through-holes T and includes two reflective layers 510 and a spacer layer 520 between the two reflective layers 510. In some embodiments, the patterned Fabry-Perot filter layers 50 directly contact the low-refractive-index layer 40 and the color conversion layers 30. In some embodiments, the color conversion layers 30 are also disposed in or filled in the through-holes T of the patterned Fabry-Perot filter layers 50.

In this embodiment, the material of the two reflective layers 510 includes silver, and the material of the spacer layer 520 includes silicon oxide. Since the light emitted by the light-emitting substrate 10 has a different color from that of the colored light that has been converted into by the color conversion layers 30, by using the low-refractive-index layer 40 in combination with the patterned Fabry-Perot filter layers 50, the colored light converted into by the color conversion layers 30 may be transmitted, but the leaked light that is not converted by the color conversion layers 30 may be reflected back into the color conversion layers 30 to improve the light conversion efficiency. In addition, the through-holes T may increase the transmittance of the colored light that has been converted into by the color conversion layers 30. Therefore, through the design of the above materials and structures, the light conversion efficiency and the color purity of the color of the outgoing light can be improved.

In some embodiments, the material of the two reflective layers 510 may also include aluminum, molybdenum, ytterbium, platinum, palladium, gold, nickel, neodymium, iridium, chromium or other suitable materials, or a combination of the above materials. In some embodiments, the thickness of the two reflective layers 510 may be the same or different. The thickness of the two reflective layers 510 is between 5 nm and 25 nm (including end values). If it is less than 5 nm or more than 25 nm, it may lead to a decrease in the filtering function of the patterned Fabry-Perot filter layers 50.

The material of the spacer layer 520 may also include magnesium fluoride, lithium chloride, aluminum oxide, silicon nitride, indium tin oxide or other suitable materials, or a combination of the above materials. The material of the low-refractive-index layer 40 may include silicon oxide or other suitable materials, or a combination of the above materials. The low-refractive-index layer 40, the reflective layers 510 and the spacer layer 520 may be formed using a thin film deposition process, a lithography process and an etching process. In some embodiments, the thickness of the spacer layer 520 is less than the thickness of the low-refractive-index layer 40. For example, the thickness of the spacer layer 520 is between 50 nm and 190 nm (including end values), for example, between 120 nm and 150 nm (including end values). The thickness of the low-refractive-index layer 40 is between 50 nm and 1000 nm (including end values).

In some embodiments, the emission wavelength of the colored light which the light emitted by the light-emitting substrate 10 is converted into by the color conversion layers 30 is λ, the thickness of the spacer layer 520 is t, the refractive index of the spacer layer 520 is n, and the optical thickness of the spacer layer 520 is $$n \times t = \frac{1}{4}\lambda \pm 10\%.$$

Since the light emitted by the light-emitting substrate 10 has a different color (i.e., a different wavelength) from that of the colored light converted into by the color conversion layers 30, through the design of the above optical thickness, the colored light that has been converted into by the color conversion layers 30 may be transmitted, but the leaked light that is not converted by the color conversion layers 30 may be reflected back into the color conversion layers 30 to improve the light conversion efficiency. In some embodiments, the optical thickness of the spacer layer 520 is between 100 nm and 280 nm (including end values), for example, between 170 nm and 220 nm (including end values).

Figure 3:
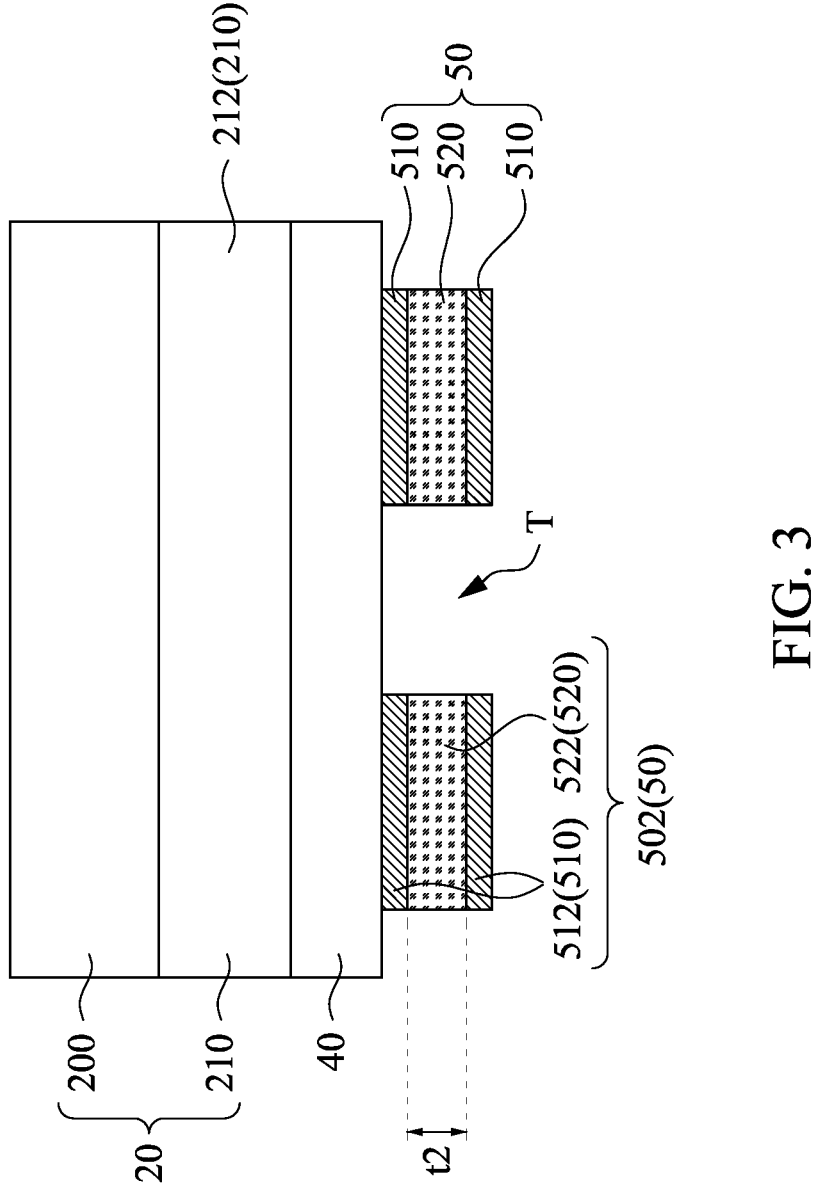
FIG. 3 is an enlarged schematic diagram of an area B in FIG. 1.

FIG. 3 is an enlarged schematic diagram of an area B in FIG. 1. Referring to FIGS. 1, 2, and 3, in order to simplify the expression of the figure, FIG. 1 merely depicts two color conversion layers 30 and two patterned Fabry-Perot filter layers 50. Since these patterned Fabry-Perot filter layers 50 are not identical to each other, and in order to describe the characteristics of these patterned Fabry-Perot filter layers 50 explicitly, these patterned Fabry-Perot filter layers 50 here are distinguished as first patterned Fabry-Perot filter layers 501 (as shown in FIG. 2) and second patterned Fabry-Perot filter layers 502 (as shown in FIG. 3). That is, these patterned Fabry-Perot filter layers 50 include multiple first patterned Fabry-Perot filter layers 501 and multiple second patterned Fabry-Perot filter layers 502.

Similarly, these color conversion layers 30 are not identical to each other, and in order to describe the characteristics of these color conversion layers 30 explicitly, these color conversion layers 30 here are distinguished as a first color conversion layer 301 and a second color conversion layer 302 (as shown in FIG. 1). That is, these color conversion layers 30 include multiple first color conversion layers 301 and multiple second color conversion layers 302. In addition, it can be understood that other first color conversion layers 301, second color conversion layers 302, first patterned Fabry-Perot filter layers 501 and second patterned Fabry-Perot filter layers 502 may also be included where not shown on the page of the figure.

As shown in FIGS. 1, 2 and 3, the first color conversion layers 301 and the second color conversion layers 302 are used to convert the light emitted by the light-emitting substrate 10 into first colored light and second colored light, respectively, where the color of the first colored light is different from the color of the second colored light. Each first patterned Fabry-Perot filter layer 501 is disposed between each first color conversion layer 301 and the low-refractive-index layer 40, respectively. In other words, each first patterned Fabry-Perot filter layer 501 may be disposed between the first color conversion layer 301 and the low-refractive-index layer 40 adjacent to the first color conversion layer 301, as shown in FIG. 1. Similarly, each second patterned Fabry-Perot filter layer 502 is disposed between each second color conversion layer 302 and the low-refractive-index layer 40. That is, each second patterned Fabry-Perot filter layer 502 is disposed between the second color conversion layer 302 and the low-refractive-index layer 40 adjacent to the second color conversion layer 302.

Each first patterned Fabry-Perot filter layer 501 includes a first intermediate layer 521, and each second patterned Fabry-Perot filter layer 502 includes a second intermediate layer 522, where the thickness t1 of the first intermediate layer 521 is different from the thickness t2 of the second intermediate layer 522. Since the patterned Fabry-Perot filter layers 50 are distinguished as the first patterned Fabry-Perot filter layers 501 and the second patterned Fabry-Perot filter layers 502, the first intermediate layer 521 and the second intermediate layer 522 are equivalent to the aforementioned spacer layer (e.g., the spacer layer 520).

Since the light emitted by the light-emitting substrate 10 has a different color from those of both the first colored light and the second colored light, by using the low-refractiveindex layer 40 in combination with the first patterned Fabry-Perot filter layers 501 and the second patterned Fabry-Perot filter layers 502 which respectively include the intermediate layers of different thicknesses, the first colored light and the second colored light may be transmitted, respectively, but the leaked light that is not converted by the color conversion layers 30 may be reflected back into the color conversion layers 30 to improve the light conversion efficiency. In addition, the through-holes T may increase the transmittance of the colored light that has been converted into by the color conversion layers 30. Therefore, through the design of the above structures, the light conversion efficiency and the color purity of the color of the outgoing light can be improved.

As shown in FIGS. 2 and 3, the first patterned Fabry-Perot filter layer 501 also includes two first reflective layers 511, and the first intermediate layer 521 is located between the two first reflective layers 511. The second patterned Fabry-Perot filter layer 502 also includes two second reflective layers 512, and the second intermediate layer 522 is located between the two second reflective layers 512. In some embodiments, the thicknesses of these first reflective layers 511 are substantially identical to each other, and the thicknesses of these second reflective layers 512 are substantially identical to each other.

In some embodiments, the thickness t1 of the first intermediate layer 521 is less than that of the low-refractive-index layer 40, and the thickness t2 of the second intermediate layer 522 is less than the thickness of the low-refractive-index layer 40. The light emitted by the light-emitting substrate 10 is converted into the first colored light and the second colored light by the first color conversion layer 301 and the second color conversion layer 302, respectively. In some embodiments, the wavelength of the first colored light is greater than that of the second colored light, and the thickness t1 of the first intermediate layer 521 is greater than the thickness t2 of the second intermediate layer 522.

In some embodiments, the emission wavelengths of the first colored light and the second colored light are $\lambda 1$ and $\lambda 2$, respectively, the thicknesses of the first intermediate layer 521 and the second intermediate layer 522 are t1 and t2, respectively, the refractive indices of the first intermediate layer 521 and the second intermediate layer 522 are n1 and n2, respectively, and the optical thickness of the first intermediate layer 521 is about $$n1 \times t1 = \frac{1}{4}\lambda 1 \pm 10\%,$$

and the optical thickness of the second intermediate layer 522 is about $$n2 \times t2 = \frac{1}{4}\lambda 2 \pm 10\%.$$

Since the light emitted by the light-emitting substrate 10 has a different color (i.e., a different wavelength) from those of both the first colored light and the second colored light, through the design of the above optical thicknesses of the first intermediate layer 521 and the second intermediate layer 522, the first colored light and the second colored light that have been converted into by the first color conversion layer 301 and the second color conversion layer 302 may be transmitted, respectively, but the leaked light that is emitted by the light-emitting substrate 10 but not converted by the first color conversion layer 301 and the second color conversion layer 302 may be reflected back into the first color conversion layer 301 and the second color conversion layer 302, respectively, to improve the light conversion efficiency.

For example, when the first colored light is red (a wavelength approximately between 589 nm to 780 nm), the optical thickness of the first intermediate layer 521 is between 130 nm and 220 nm (including end values), for example, between 200 nm and 215 nm (including end values). When the second colored light is green (a wavelength approximately between 485 nm and 588 nm), the optical thickness of the second intermediate layer 522 is between 100 nm and 190 nm (including end values), for example, between 160 nm and 175 nm (including end values).

With continued reference to FIG. 1, the light-emitting substrate 10 includes a first substrate 100, a driving circuit layer 110, multiple light-emitting elements 120, a black spacer layer 130, a filling layer 140 and an encapsulation layer 150. The driving circuit layer 110 is disposed on the first substrate 100. The light-emitting elements 120 are disposed on the driving circuit layer 110 and electrically connected to the driving circuit layer 110, and arranged in a first direction D1. The black spacer layer 130 is disposed on the driving circuit layer 110, and disposed alternately with the light-emitting elements 120 in the first direction D1. The filling layer 140 and the encapsulation layer 150 are disposed on the light-emitting elements 120 and the black spacer layer 130.

In some embodiments, the material of the first substrate 100 may be a glass substrate or a transparent polymer material substrate. The aforementioned transparent polymer material is, for example, made of polyethylene terephthalate (PET) or polyimide (PI). The driving circuit layer 110 may include elements or lines required for the display device 1, such as drive elements, switch elements, storage capacitors, power lines, driving signal lines, timing signal lines, current compensation lines, and detection signal lines. For example, the driving circuit layer 110 may be formed by using a thin film deposition process, a lithography process, and an etching process.

The light-emitting elements 120 may be light-emitting diodes (LEDs), such as sub-millimeter-light-emitting diodes (mini LEDs) or micro-light-emitting diodes (micro LEDs, μLEDs). The thickness of the micro-light-emitting diode is below 10 micrometers, for example 6 micrometers. Sub-millimeter-light-emitting diodes can be divided into two types: one contains encapsulant and the other does not contain encapsulant. The thickness of sub-millimeter-light-emitting diode containing encapsulant can be less than 800 micrometers, and the thickness of sub-millimeter-light-emitting diode without encapsulant can be less than 100 micrometers. In addition, the light-emitting elements 120 can also be large-sized regular LEDs other than sub-millimeter-light-emitting diodes and micro-light-emitting diodes, so the light-emitting elements 120 are not limited to being sub-millimeter-light-emitting diodes or micro-light-emitting diodes of smaller size.

The material of the black spacer layer 130 may be ink or photoresist. The material of the filling layer 140 and the encapsulation layer 150 may be an organic insulating material, an inorganic insulating material, or a combination thereof. For example, the organic insulating material may be polyimide, polyamic acid (PAA), polyamide (PA), polyvinyl alcohol (PVA), polyvinyl cinnamate (PVCi), polymethyl methacrylate (PMMA), other suitable photoresist materials, or a combination thereof. The inorganic insulating material may be silicon oxide, silicon nitride, silicon oxynitride, siloxane or other suitable insulating materials. In some embodiments, the black spacer layer 130, the filling layer 140 and the encapsulation layer 150 may be formed by using an ink-jetting process, a printing process or a photolithography process.

With continued reference to FIG. 1, the display device 1 also includes multiple scattering layers 31 and an isolation layer 60, which are disposed between the light-emitting substrate 10 and the counter substrate 20. In order to simplify the expression of the figure, FIG. 1 merely depicts one scattering layer 31 as a representative representation. However, it can be understood that other scattering layers 31 may also be included where not shown on the page of the figure. Specifically, the first color conversion layers 301, the second color conversion layers 302 and the scattering layers 31 are arranged in sequence in the first direction D1, and the isolation layer 60 is disposed alternately with the first color conversion layers 301, the second color conversion layers 302 and the scattering layers 31 in the first direction D1.

In some embodiments, the color conversion layers 30 may include phosphors, quantum dots (QDs), or wavelength conversion materials of similar properties, such as silicates, silicon nitrides, sulfides, quantum dots, garnets or other suitable materials, or a combination of the above materials, such that the light emitted by the light-emitting element 120 is converted into colored light with a desired color. The color conversion layers 30 may be formed by using a spin coating process or a spray coating process.

In this embodiment, the first color conversion layer 301 and the second color conversion layer 302 may be quantum dot color conversion layers, where the first color conversion layer 301 and the second color conversion layer 302 may respectively include ink and quantum dots of different sizes. In this way, the quantum dots of the first color conversion layer 301 may be excited by the light energy from the light-emitting element 120 to release the first colored light, and the quantum dots of the second color conversion layer 302 may be excited by the light energy from the light-emitting element 120 to release the second colored light. For example, the light emitted by the light-emitting element 120 is blue light, the first colored light released by the first color conversion layer 301 is red light, and the second colored light released by the second color conversion layer 302 is green light.

In some embodiments, the material of the scattering layer 31 may include resin with light scattering agents such as micro-particles that scatter light, or other suitable materials, or a combination of the above materials. In this way, the light emitted by the light-emitting element 120 may be scattered or diffused by the scattering layer 31, thereby increasing the light quantity of the visible light. The material of the isolation layer 60 may include acrylic resin, silicone, photoresist or other suitable materials, or a combination of the above materials. The scattering layer 31 and the isolation layer 60 may be formed by using a coating process, an ink-jetting process, a printing process or a photolithography process.

With continued reference to FIG. 1, the counter substrate 20 has multiple sub-pixel areas PX. Each sub-pixel area PX has a sub-pixel width PW in the first direction D1. Each through-hole T of the patterned Fabry-Perot filter layer 50 has an opening width OW in the first direction D1. The opening width OW is greater than or equal to 1 μm, and less than the sub-pixel width PW. Through the design of the above structure, the transmittance of the colored light that has been converted into by the color conversion layer 30 may be increased. In addition, since the opening width OW is greater than or equal to 1 μm, the through-hole T is prevented from generating diffraction sufficient to affect the image quality, thereby maintaining or improving the image quality.

The counter substrate 20 includes a second substrate 200, multiple color filter layers 210, multiple light-transmitting layers 220 and a black matrix layer 230. The color filter layers 210, the light-transmitting layers 220 and the black matrix layer 230 are disposed on the second substrate 200. The black matrix layer 230 is disposed alternately with the color filter layers 210 and the light-transmitting layers 220 in the first direction D1. In order to simplify the expression of the figure, FIG. 1 merely depicts one first color filter layer 211, one second color filter layer 212 and one light-transmitting layer 220 as representative representations. However, it can be understood that other first color filter layers 211, second color filter layers 212 and light-transmitting layers 220 may also be included where not shown on the page of the figure.

As shown in FIG. 1, the color filter layers 210 include multiple first color filter layers 211 and multiple second color filter layers 212, where the first color filter layers 211 are different from the second color filter layers 212. The first color filter layers 211, the second color filter layers 212 and the light-transmitting layers 220 are arranged in the first direction D1. The first color filter layer 211 is disposed corresponding to (i.e., in alignment with) the first patterned Fabry-Perot filter layer 501 and the first color conversion layer 301. The second color filter layer 212 is disposed correspond to (i.e., in alignment with) the second patterned Fabry-Perot filter layer 502 and the second color conversion layer 302. The light-transmitting layer 220 is disposed corresponding to (i.e., in alignment with) the scattering layer 31.

Specifically, the first patterned Fabry-Perot filter layer 501 is disposed between the first color filter layer 211 and the first color conversion layer 301. The low-refractive-index layer 40 is disposed between the first color filter layer 211 and the first patterned Fabry-Perot filter layer 501. The second patterned Fabry-Perot filter layer 502 is disposed between the second color filter layer 212 and the second color conversion layer 302. The low-refractive-index layer 40 is disposed between the second color filter layer 212 and the second patterned Fabry-Perot filter layer 502. The low-refractive-index layer 40 is disposed between the light-transmitting layer 220 and the scattering layer 31. That is, there is no patterned Fabry-Perot filter layer 50 disposed between the light-transmitting layer 220 and the scattering layer 31.

In some embodiments, the material of the second substrate 200 may be a glass substrate or a transparent polymer material substrate. The aforementioned transparent polymer material is, for example, made of polyethylene terephthalate or polyimide. The color filter layer 210, the light-transmitting layer 220 and the black matrix layer 230 may respectively include color photoresist, transparent photoresist, black photoresist or other suitable materials, or a combination of the above materials. The first color filter layer 211 and the second color filter layer 212 may respectively render different colors, such that the display device 1 can emit different colored light. For example, the first color filter layer 211 and the second color filter layer 212 are a red color filter layer and a green color filter layer, respectively. The color filter layer 210, the light-transmitting layer 220 and the black matrix layer 230 may be formed by using a coating process, an ink-jetting process, a printing process or a photolithography process.

Figure 4:
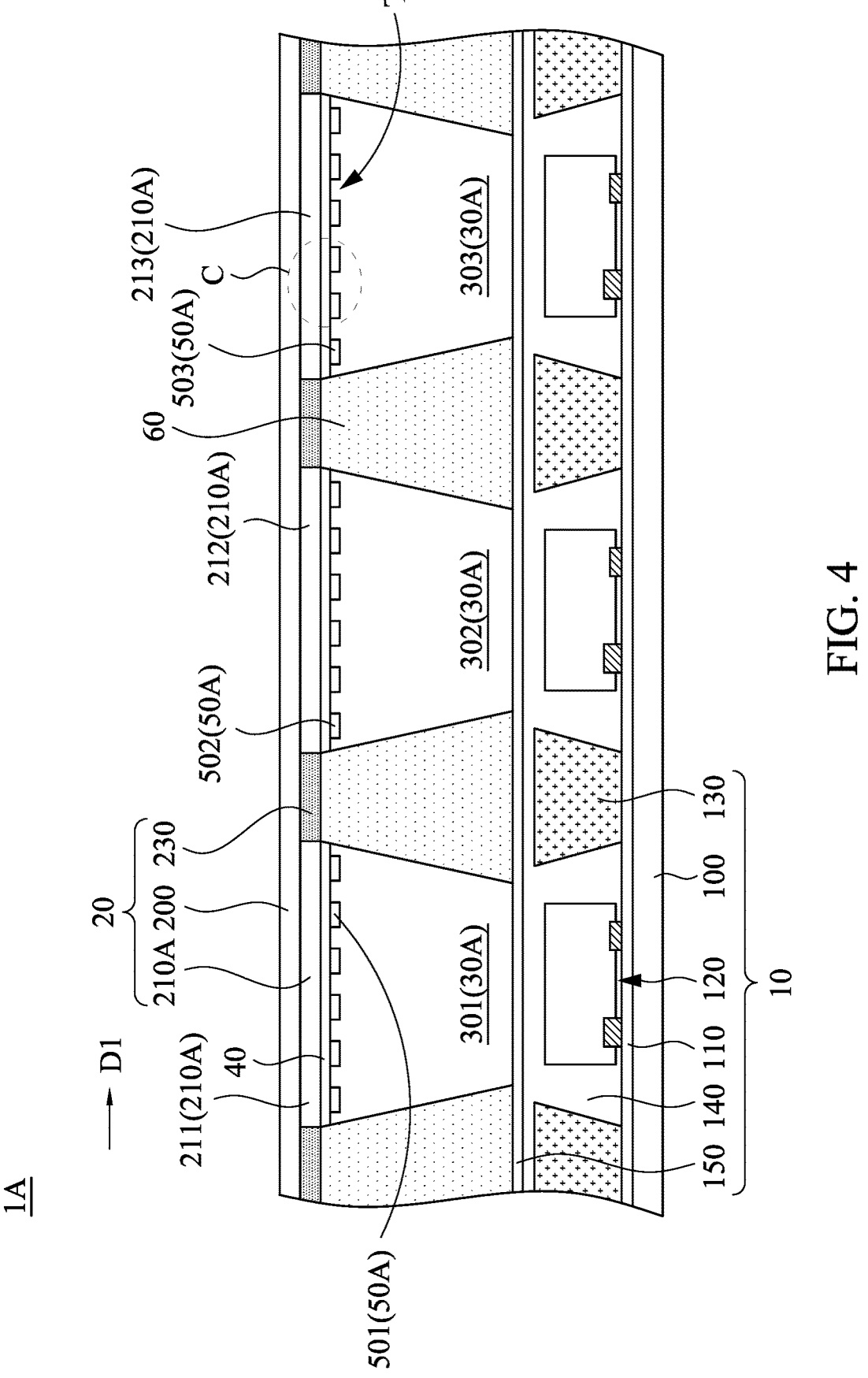
FIG. 4 is a partial cross-sectional schematic diagram of a display device according to at least another embodiment of the present disclosure.

FIG. 4 is a partial cross-sectional schematic diagram of a display device according to at least another embodiment of the present disclosure. Referring to FIG. 4, most of the component structures, materials, processes, and relative positional relationships of the embodiment of FIG. 4 are the same as those of the embodiment of FIG. 1, so the same technical features will not be described again here. The difference between the two embodiments is color filter layers 210A, color conversion layers 30A and patterned Fabry-Perot filter layers 50A of a display device 1A of FIG. 4. In some embodiments, the display device 1A is not provided with the light-transmitting layer 220 and the scattering layer 31. In order to simplify the expression of the figure, FIG. 4 merely depicts one third color filter layer 213, one third color conversion layer 303 and one third patterned Fabry-Perot filter layer 503 as representative representations. However, it can be understood that other third color filter layers 213, third color conversion layers 303 and third patterned Fabry-Perot filter layers 503 may also be included where not shown on the page of the figure.

Specifically, in addition to the first color filter layers 211 and the second color filter layers 212, the color filter layers 210A include multiple third color filter layers 213. In addition to the first color conversion layers 301 and the second color conversion layers 302, the color conversion layers 30A include multiple third color conversion layers 303. In addition to the first patterned Fabry-Perot filter layers 501 and the second patterned Fabry-Perot filter layers 502, the patterned Fabry-Perot filter layers 50A include multiple third patterned Fabry-Perot filter layers 503. Each third patterned Fabry-Perot filter layer 503 is respectively disposed between each third color conversion layer 303 and the low-refractive-index layer 40. That is, each third patterned Fabry-Perot filter layer 503 is disposed between the third color conversion layer 303 and the low-refractive-index layer 40 adjacent to the third color conversion layer 303.

As shown in FIG. 4, the third patterned Fabry-Perot filter layer 503 is disposed between the third color filter layer 213 and the third color conversion layer 303. The low-refractive-index layer 40 is disposed between the third color filter layer 213 and the third patterned Fabry-Perot filter layer 503. The third color conversion layer 303 is used to convert the light emitted by the light-emitting substrate 10 into third colored light. The color of the third colored light is different from those of the first colored light and the second colored light. In other words, the colors of the first colored light, the second colored light and the third colored light are different from each other.

In some embodiments, the colors of the first colored light, the second colored light and the third colored light are red, green and yellow, respectively. In some embodiments, in addition to the first color filter layer 211, the second color filter layer 212 and the third color filter layer 213, the first color conversion layer 301, the second color conversion layer 302 and the third color conversion layer 303, the display device 1A includes a light-transmitting layer 220 and a scattering layer 31.

Figure 5:
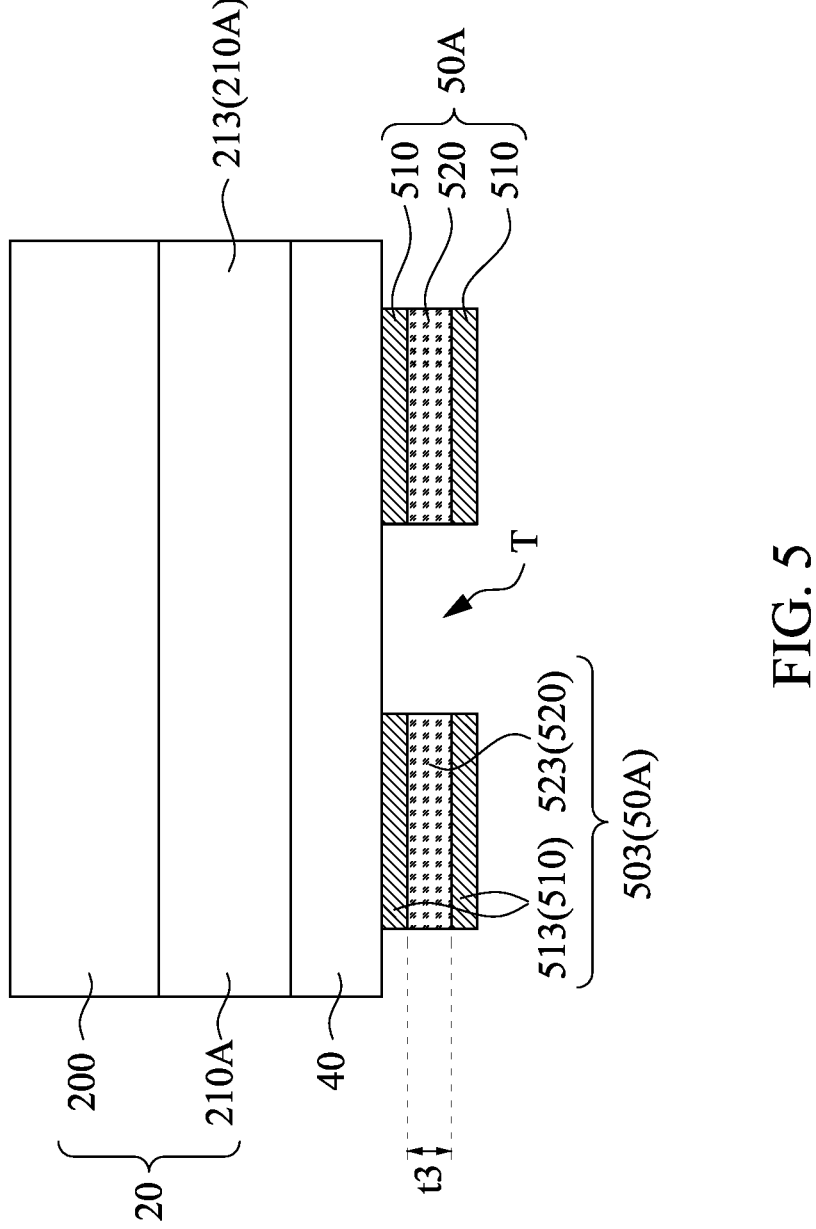
FIG. 5 is an enlarged schematic diagram of an area C in FIG. 4.

FIG. 5 is an enlarged schematic diagram of an area C in FIG. 4. Referring to FIG. 5, the third patterned Fabry-Perot filter layer 503 includes a third intermediate layer 523. The thickness t3 of the third intermediate layer 523 is different from the thickness t1 of the first intermediate layer 521 and the thickness t2 of the second intermediate layer 522. In other words, the thickness t1 of the first intermediate layer

521, the thickness t2 of the second intermediate layer 522, and the thickness t3 of the third intermediate layer 523 are different from each other. The third intermediate layer 523 is equivalent to the aforementioned spacer layer (e.g., the spacer layer 520).

Since the light emitted by the light-emitting substrate 10 has a different color from those of the first colored light, the second colored light and the third colored light, by using the low-refractive-index layer 40 in combination with the first patterned Fabry-Perot filter layers 501, the second patterned Fabry-Perot filter layers 502 and the third patterned Fabry-Perot filter layers 503 which respectively include the intermediate layers of different thicknesses, the first colored light, the second colored light and the third colored light may be transmitted, respectively, but the leaked light that is not converted by the color conversion layers 30 may be reflected back into the color conversion layers 30 to improve the light conversion efficiency.

As shown in FIG. 5, the third patterned Fabry-Perot filter layer 503 also includes two third reflective layers 513, and the third intermediate layer 523 is located between the two third reflective layers 513. In some embodiments, the thicknesses of these third reflective layers 513 are the same.

In some embodiments, the thickness t3 of the third intermediate layer 523 is less than the thickness of the low-refractive-index layer 40. The light emitted by the light-emitting substrate 10 is converted into the third colored light by the third color conversion layer 303. In some embodiments, the wavelength of the first colored light>the wavelength of the second colored light>the wavelength of the third colored light, and the thickness t1 of the first intermediate layer 521>the thickness t2 of the second intermediate layer 522>the thickness t3 of the third intermediate layer 523. The emission wavelength of the third colored light is λ3, respectively, the thickness of the third intermediate layer 523 is t3, the refractive index of the third intermediate layer 523 is n3, and the optical thickness of the third intermediate layer 523 is n3×t3=¼λ3±10%.

Since the light emitted by the light-emitting substrate 10 has a different color (i.e., a different wavelength) from those of the first colored light, the second colored light and the third colored light, through the design of the optical thicknesses of the first intermediate layer 521, the second intermediate layer 522 and the third intermediate layer 523 of the aforementioned patterned Fabry-Perot filter layers 50, the first colored light, the second colored light and the third colored light that have been converted into by the first color conversion layer 301, the second color conversion layer 302 and the third color conversion layer 303 may be transmitted, respectively, but the leaked light that is not converted by the first color conversion layer 301, the second color conversion layer 302 and the third color conversion layer 303 may be reflected back into the first color conversion layer 301, the second color conversion layer 302 and the third color conversion layer 303, respectively, to improve the light conversion efficiency.

In summary, in the above display device according to the at least one embodiment of the present disclosure, by providing the patterned Fabry-Perot filter layers, the colored light that has been converted into by the color conversion layers can be transmitted, but the leaked light that is not converted by the color conversion layers is reflected back into the color conversion layers to improve the light conversion efficiency. In addition, the through-holes of the patterned Fabry-Perot filter layers may increase the transmittance of the colored light that has been converted into by the color conversion layers. Therefore, the light conversion efficiency of the display device and the color purity of the color of the outgoing light can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A display device, comprising:
a light-emitting substrate, used to emit a light;
a counter substrate, disposed opposite to the light-emitting substrate;
multiple color conversion layers, disposed between the light-emitting substrate and the counter substrate;
a low-refractive-index layer, disposed between the counter substrate and the color conversion layers, wherein a refractive index of the low-refractive-index layer is less than or equal to a refractive index of each of the color conversion layers; and
multiple patterned Fabry-Perot filter layers, disposed between the low-refractive-index layer and the color conversion layers, and each of the patterned Fabry-Perot filter layers having multiple through-holes and comprising two reflective layers and a spacer layer between the two reflective layers, wherein a material of the two reflective layers comprises silver, and a material of the spacer layer comprises silicon oxide.

2. The display device according to claim 1, wherein the counter substrate has multiple sub-pixel areas, each of the sub-pixel areas has a sub-pixel width in a first direction, each of the through-holes has an opening width in the first direction, and the opening width is greater than or equal to 1 µm, and less than the sub-pixel width.

3. The display device according to claim 1, wherein the color conversion layers convert the light into a colored light, a emission wavelength of colored light is λ, a thickness of the spacer layer is t, and a refractive index of the spacer layer is n, wherein $$n \times t = \frac{1}{4}\lambda \pm 10\%.$$

4. The display device according to claim 1, wherein a thickness of the spacer layer is smaller than a thickness of the low-refractive-index layer.

5. The display device according to claim 1, wherein the refractive index of the low-refractive-index layer is in a range of 1.2 and 1.9.

6. The display device according to claim 1, wherein the refractive index of the color conversion layer is in a range of 1.6 and 2.2.

7. The display device according to claim 1, wherein thicknesses of the two reflective layers are substantially identical to each other.

8. A display device, comprising:
a light-emitting substrate, used to emit a light;
a counter substrate, disposed opposite to the light-emitting substrate;

multiple color conversion layers, disposed between the light-emitting substrate and the counter substrate, and comprising multiple first color-conversion layers and multiple second color conversion layers used to convert the light into a first colored light and a first colored light, respectively, wherein a color of the first colored light is different from a color of the second colored light;

a low-refractive-index layer, disposed between the counter substrate and the color conversion layers, wherein a refractive index of the low-refractive-index layer is less than or equal to a refractive index of each of the color conversion layers; and multiple patterned Fabry-Perot filter layers, each of the patterned Fabry-Perot filter layers having multiple through-holes, and the patterned Fabry-Perot filter layers comprising multiple first patterned Fabry-Perot filter layers and multiple second patterned Fabry-Perot filter layers, wherein each of the first patterned Fabry-Perot filter layers is disposed between each of the first color conversion layers and the low-refractive-index layer and comprises a first intermediate layer, and each of the second patterned Fabry-Perot filter layers is disposed between each of the second color conversion layers and the low-refractive-index layer and comprises a second intermediate layer, wherein a thickness of the first intermediate layer is different from a thickness of the second intermediate layer.

9. The display device according to claim 8, wherein the counter substrate has multiple sub-pixel areas, each of the sub-pixel areas has a sub-pixel width in a first direction, each of the through-holes has an opening width in the first direction, and the opening width is greater than or equal to 1 μm, and less than the sub-pixel width.

10. The display device according to claim 8, wherein an emission wavelength of the first colored light is $\lambda 1$, the thickness of the first intermediate layer is t1, and a refractive index of the first intermediate layer is n1, wherein $$n1 \times t1 = \frac{1}{4}\lambda 1 \pm 10\%.$$

11. The display device according to claim 8, wherein an emission wavelength of the second colored light is $\lambda 2$, the thickness of the second intermediate layer is t2, and a refractive index of the second intermediate layer is n2, wherein $$n2 \times t2 = \frac{1}{4}\lambda 2 \pm 10\%.$$

12. The display device according to claim 8, wherein the thickness of the first intermediate layer is less than a thickness of the low-refractive-index layer, and the thickness of the second intermediate layer is less than the thickness of the low-refractive-index layer.

13. The display device according to claim 8, wherein an emission wavelength of the first colored light is greater than an emission wavelength of the second colored light, and the thickness of the first intermediate layer is greater than the thickness of the second intermediate layer.

14. The display device according to claim 8, wherein the refractive index of the low-refractive-index layer is in a range of 1.2 and 1.9.

15. The display device according to claim 8, wherein the refractive index of the color conversion layer is in a range of 1.6 and 2.2.

16. The display device according to claim 8, wherein each of the first patterned Fabry-Perot filter layers comprises two first reflective layers, and the first intermediate layer is located between the two first reflective layers.

17. The display device according to claim 16, wherein thicknesses of the two first reflective layers are substantially identical to each other.

18. The display device according to claim 8, wherein the second patterned Fabry-Perot filter layer comprises two second reflective layers, and the second intermediate layer is located between the two second reflective layers.

19. The display device according to claim 18, wherein thicknesses of the two second reflective layers are substantially identical to each other.

* * * * *